United States Patent
Chou et al.

(10) Patent No.: US 10,347,325 B1
(45) Date of Patent: Jul. 9, 2019

(54) DDR4 MEMORY I/O DRIVER

(71) Applicant: REALTEK SEMICONDUCTOR CORPORATION, Hsinchu (TW)

(72) Inventors: Gerchih Chou, San Jose, CA (US); Li-Jun Gu, Jiangsu Province (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/023,367

(22) Filed: Jun. 29, 2018

(51) Int. Cl.
*G11C 11/4096* (2006.01)
*G11C 7/10* (2006.01)
*H03K 19/0948* (2006.01)
*G11C 11/4099* (2006.01)
*G11C 11/4074* (2006.01)

(52) U.S. Cl.
CPC ........ *G11C 11/4096* (2013.01); *G11C 7/1069* (2013.01); *G11C 11/4074* (2013.01); *G11C 11/4099* (2013.01); *H03K 19/0948* (2013.01)

(58) Field of Classification Search
CPC .............. G11C 11/4096; G11C 7/1069; G11C 11/4074; G11C 11/4099; H03K 19/0948
USPC .................................... 365/233.13
See application file for complete search history.

(56) References Cited

U.S. PATENT DOCUMENTS

| 9,152,257 | B2* | 10/2015 | McCall | H03K 19/0005 |
| 2014/0184523 | A1* | 7/2014 | McCall | H03K 19/0005 345/173 |
| 2016/0285451 | A1* | 9/2016 | McCall | H03K 19/0005 |

* cited by examiner

*Primary Examiner* — Harry W Byrne
(74) *Attorney, Agent, or Firm* — WPAT, PC (57) ABSTRACT

The present invention discloses a DDR4 memory I/O driver including a pre-driver, a pull-up circuit and a pull-down circuit. The pre-driver is coupled between a first high voltage terminal and a low voltage terminal to provide a first and a second pre-driving signals. The pull-up circuit includes: a driving PMOS transistor coupled between a second high voltage terminal and a pull-up resistor, that is coupled to an output pad, to operate according to the first pre-driving signal, in which the second high voltage terminal's voltage is not higher than the first high voltage terminal's voltage. The pull-down circuit includes: a driving NMOS transistor coupled between the low voltage terminal and a cascode NMOS transistor to operate according to the second pre-driving signal; and the cascode NMOS transistor coupled between the driving NMOS transistor and a pull-down resistor, that is coupled to the output pad, to operate according to a bias.

18 Claims, 13 Drawing Sheets

DDR4 MEMORY I/O DRIVER

BACKGROUND OF THE INVENTION

1. Field of the Invention

The present invention relates to a memory I/O driver, especially to a DDR4 memory I/O driver.

2. Description of Related Art

Figure 1:
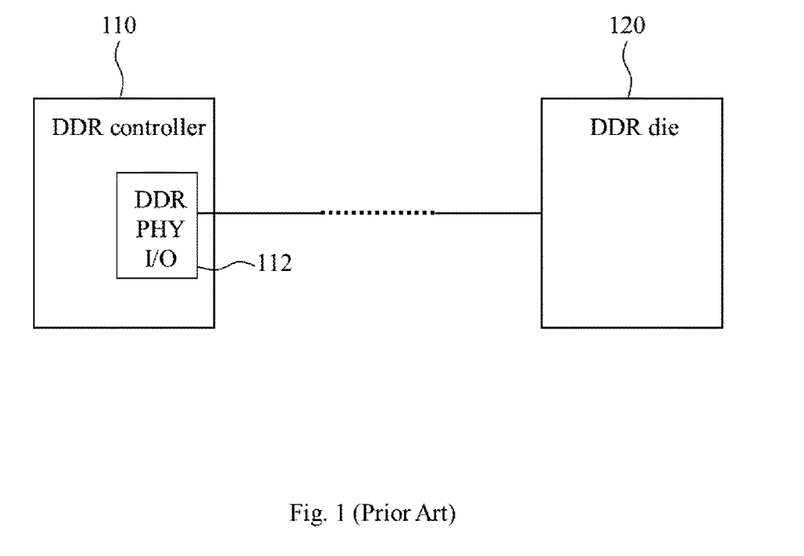
FIG. 1 shows a conventional DDR memory device.

Double Data Rate (DDR) memory is widely applied to many kinds of system-on-a-chip (SOC) for digital processing. As shown in FIG. 1, a general SOC uses a built-in DDR controller 110 to carry out data transmission with a DDR die 120 through a DDR physical interface input/output circuit (DDR PHY I/O) 112 of the DDR controller 110. Generally speaking, the high voltage of the DDR die 120 is 1.2 volt according to the specification of DDR4; the high voltage of the DDR die 120 is 1.1 volt according to the specification of low power DDR4 (LPDDR4); and the high voltage of the DDR PHY I/O 112 is equal to the high voltage of the DDR die 120.

Figure 2:
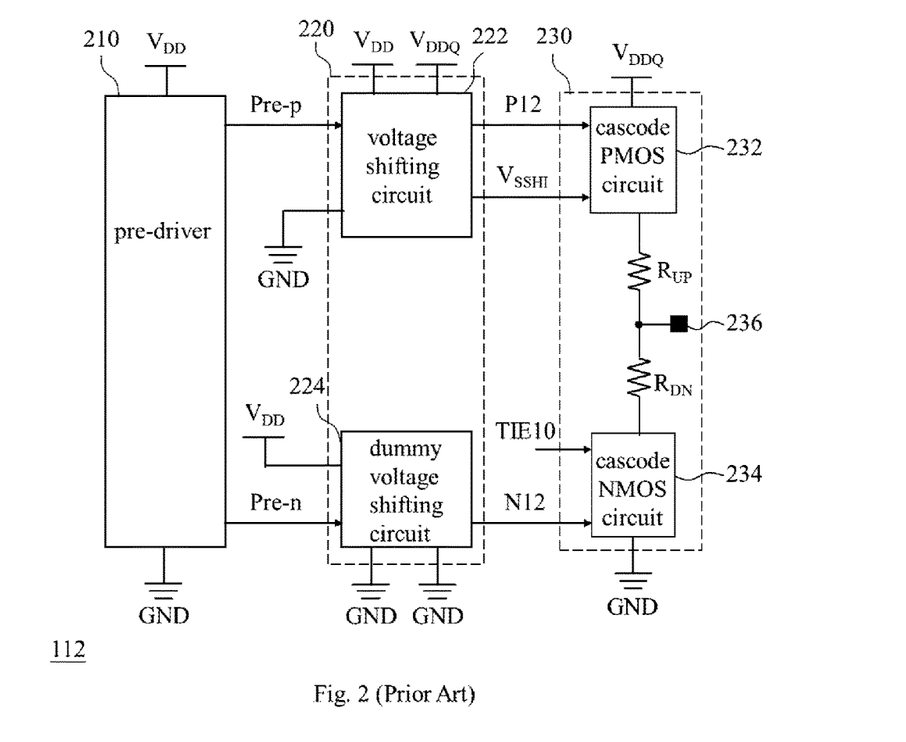
FIG. 2 shows a conventional DDR PHY I/O.

FIG. 2 shows a conventional circuit of the DDR PHY I/O 112 of FIG. 1. The DDR PHY I/O 112 of FIG. 2 includes a pre-driver 210, a voltage shifter 220 and an I/O driver 230. The pre-driver 210 is configured to operate in a core power domain and generate a pre-driving signal Pre-p and a pre-driving signal Pre-n, in which the high voltage of the core power domain is $V_{DD}$. The voltage shifter 220 includes a voltage shifting circuit 222 and a dummy voltage shifting circuit 224. The voltage shifting circuit 222 operates according to the high voltage $V_{DD}$, the high voltage $V_{DDQ}$ of an I/O power domain and a grounding voltage GND and thereby converts the pre-driving signal Pre-p of the core power domain into a pre-driving signal P12 of the I/O power domain, in which the high voltage $V_{DDQ}$ of the I/O power domain is higher than the high voltage $V_{DD}$ of the core power domain; in addition, the voltage shifting circuit 222 includes a low dropout regulator (LDO) (not shown in FIG. 2) to output a bias $V_{SSHI}$ ($V_{SSHI}=V_{DDQ}-V_{DD}$). The dummy voltage shifting circuit 224 operates according to the high voltage $V_{DD}$ of the core power domain and generates a pre-driving signal N12 according to the pre-driving signal Pre-n. The I/O driver 230 includes: a cascode PMOS circuit 232 coupled between a terminal of the high voltage $V_{DDQ}$ and a pull-up resistor $R_{UP}$; a cascode NMOS circuit 234 coupled between a pull-down resistor $R_{DN}$ and a terminal of the grounding voltage GND; and an output pad 236 coupled between the pull-up resistor $R_{UP}$ and the pull-down resistor $R_{DN}$. The cascode PMOS circuit 232 has two serially connected PMOS transistors (not shown in the figure) operating according to the pre-driving signal P12 and the bias $V_{SSHI}$ respectively; the cascode NMOS circuit 234 has two serially connected NMOS transistors (not shown in the figure) operating according to a bias TIE10 (that is equal to $V_{DD}$ here) and the pre-driving signal N12. In light of the above, in order to adapt to the difference between the core power domain and the I/O power domain, the conventional DDR PHY I/O 112 needs the voltage shifting circuit 222 to carry out voltage conversion and needs the LDO to provide the bias $V_{SSHI}$; as a result, the implementation of the conventional DDR PHY I/O 112 requires a large circuit area. Additionally, although the cascode PMOS circuit 232 has a higher withstand voltage in comparison with using a single PMOS transistor, it decreases the bandwidth of the I/O driver 230.

SUMMARY OF THE INVENTION

An object of the present invention is to provide a DDR4 memory I/O driver capable of preventing the problems of the prior art.

The DDR4 memory I/O driver of the present invention requires a smaller circuit area and provides a wider bandwidth in comparison with the prior art. A first embodiment of the DDR4 memory I/O driver includes a pre-driver, a pull-up circuit and a pull-down circuit. The pre-driver is electrically connected between a first high voltage terminal and a low voltage terminal and configured to provide a first pre-driving signal and a second pre-driving signal. The pull-up circuit includes: a driving PMOS transistor electrically connected between a second high voltage terminal and a pull-up resistor and configured to operate according to the first driving signal in a transmission mode, in which the voltage of the second high voltage terminal is not higher than the voltage of the first high voltage terminal; and the pull-up resistor electrically connected between the driving PMOS transistor and an output pad. The pull-down circuit includes: a driving NMOS transistor electrically connected between the low voltage terminal and a cascode NMOS transistor and configured to operate according to the second pre-driving signal; the cascode NMOS transistor electrically connected between the driving NMOS transistor and a pull-down resistor and configured to operate according to a bias, in which the bias is not higher than the voltage of the second high voltage terminal; and the pull-down resistor electrically connected between the cascode NMOS transistor and the output pad.

A second embodiment of the DDR4 memory I/O driver includes a pre-driver, a pull-up circuit and a pull-down circuit. In comparison with the first embodiment, the pull-down circuit of the second embodiment includes: an NMOS transistor electrically connected between the low voltage terminal and a driving cascode NMOS transistor and configured to operate according to an enablement signal; the driving cascode NMOS transistor electrically connected between the NMOS transistor and a pull-down resistor and configured to operate according to the second pre-driving signal; and the pull-down resistor electrically connected between the driving cascode NMOS transistor and the output pad. The voltage of the said enablement signal is equal to the voltage of the second high voltage terminal in the transmission mode.

A third embodiment of the DDR4 memory I/O driver includes a pre-driver, a pull-up circuit and a pull-down circuit. In comparison with the first embodiment, the pull-down circuit of the third embodiment includes: a driving NMOS transistor electrically connected between the low voltage terminal and a pull-down resistor and configured to operate according to the second pre-driving signal; and the pull-down resistor electrically connected between the driving NMOS transistor and the output pad. This embodiment is suitable for a low power DDR4 memory device.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a Double Data Rate Fourth Generation (DDR4) memory input/output (I/O) driver capable of operating in a single power domain, consuming a smaller circuit area and providing a wider bandwidth. The DDR4 memory I/O driver of the present invention can take the place of a conventional DDR physical interface input/output circuit (e.g., the DDY PHY I/O 112 of FIG. 1).

Figure 3:
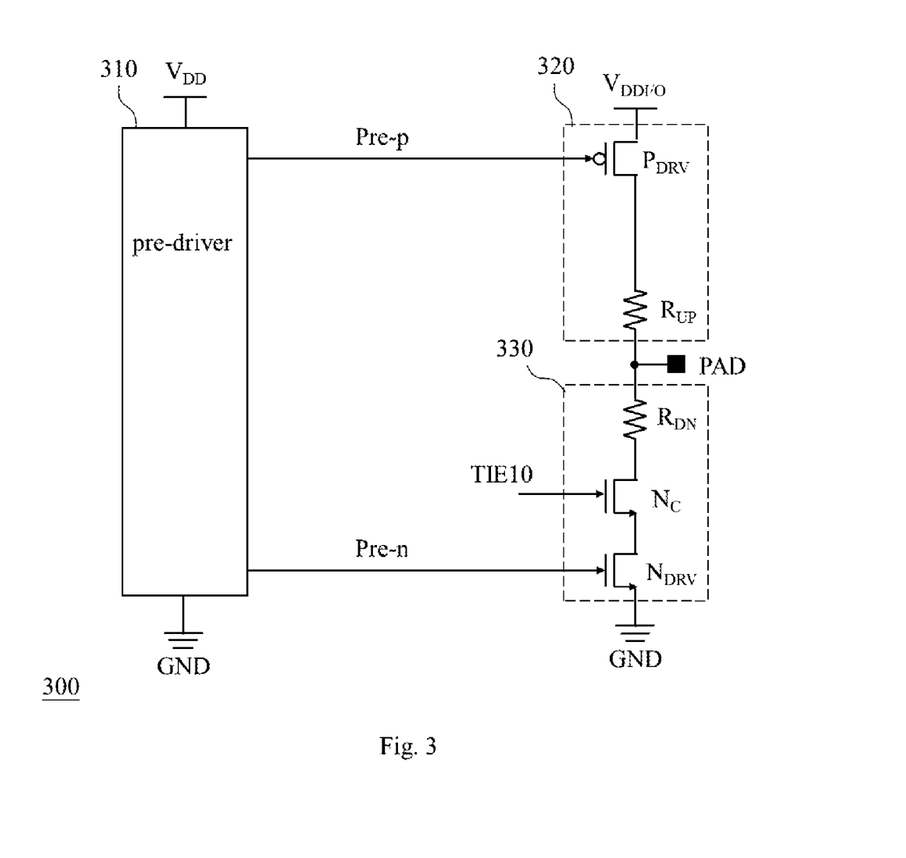
FIG. 3 shows an embodiment of the DDR4 memory I/O driver of the present invention.

FIG. 3 shows an embodiment of the DDR4 memory I/O driver of the present invention. The DDR4 memory I/O driver 300 of FIG. 3 includes a pre-driver 310, a pull-up circuit 320 and a pull-down circuit 330.

Please refer to FIG. 3. The pre-driver 310 is electrically connected between a first high voltage terminal $V_{DD}$ and a low voltage terminal GND and configured to provide a first pre-driving signal Pre-p and a second pre-driving signal Pre-n, in which an exemplary implementation of the voltage of the first high voltage terminal is a voltage between 0.8 volt and 1 volt and an exemplary implementation of the voltage of the low voltage terminal GND is a grounding voltage (e.g., 0 volt). The pre-driver 310 can be a known pre-driver (e.g., the pre-driver 210 of FIG. 2) or a self-developed pre-driver.

Please refer to FIG. 3. The pull-up circuit 320 includes a driving PMOS transistor $P_{DRV}$ and a pull-up resistor $R_{UP}$. The driving PMOS transistor $P_{DRV}$ is electrically connected between a second high voltage terminal $V_{DDI/O}$ and the pull-up resistor $R_{UP}$ and configured to operate according to the first pre-driving signal Pre-p in a transmission mode, in which the voltage of the second high voltage terminal $V_{DDI/O}$ is not higher than the voltage of the first high voltage terminal $V_{DD}$ (e.g., the voltage of $V_{DDI/O}$ is equal to the voltage of $V_{DD}$) and the transmission mode is a mode for a DDR die (e.g., the DDR die 120 of FIG. 1) carrying out data transmission. The pull-up resistor $R_{UP}$ is electrically connected between the driving PMOS transistor $P_{DRV}$ and an output pad PAD and configured to increase a load-driving capability and/or act for impedance matching, in which the output pad PAD is configured to output the driving signal generated by the DDR4 memory I/O driver 300.

Please refer to FIG. 3. The pull-down circuit 330 includes a driving NMOS transistor $N_{DRV}$, a cascode NMOS transistor $N_C$ and a pull-down resistor $R_{DN}$. The driving NMOS transistor $N_{DRV}$ is electrically connected between the low voltage terminal GND and the cascode NMOS transistor $N_C$ and configured to operate according to the second pre-driving signal Pre-n. The cascode NMOS transistor $N_C$ is electrically connected between the driving NMOS transistor $N_{DRV}$ and the pull-down resistor $R_{DN}$ and configured to operate according to a bias TIE10. The cascode NMOS transistor $N_C$ is operable to prevent the voltage difference between the output pad PAD and the driving NMOS transistor $N_{DRV}$ from exceeding the withstand voltage of the driving NMOS transistor $N_{DRV}$. The bias TIE10 is not higher than the voltage of the second high voltage terminal $V_{DDI/O}$ (e.g., the bias TIE10 is equal to the voltage of $V_{DDI/O}$). The pull-down resistor $R_{DN}$ is electrically connected between the cascode NMOS transistor $N_C$ and the output pad PAD and configured to improve a load-driving capability and/or impedance matching.

Figure 4:
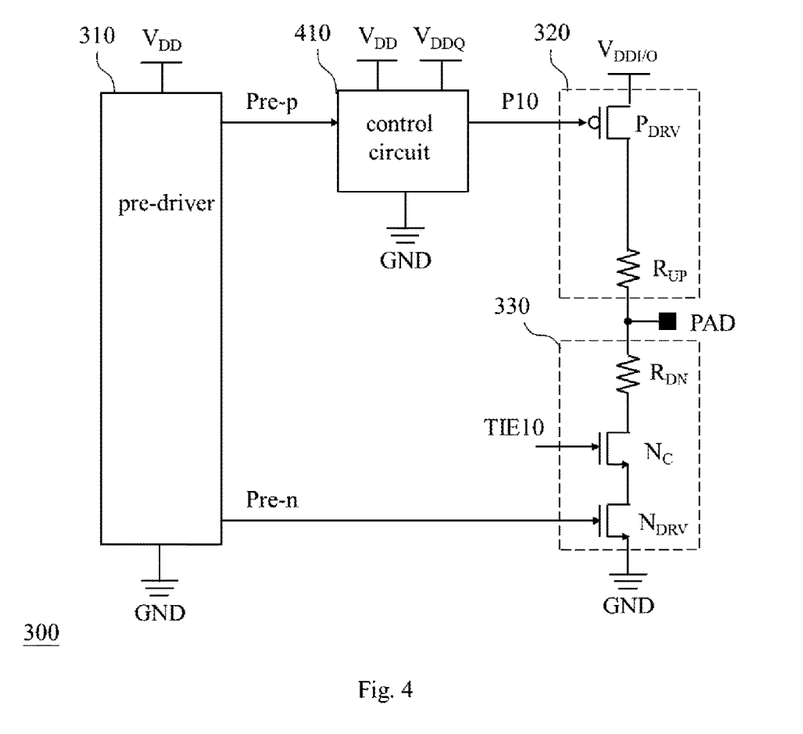
FIG. 4 shows another embodiment of the DDR4 memory I/O driver of the present invention.
Figure 5:
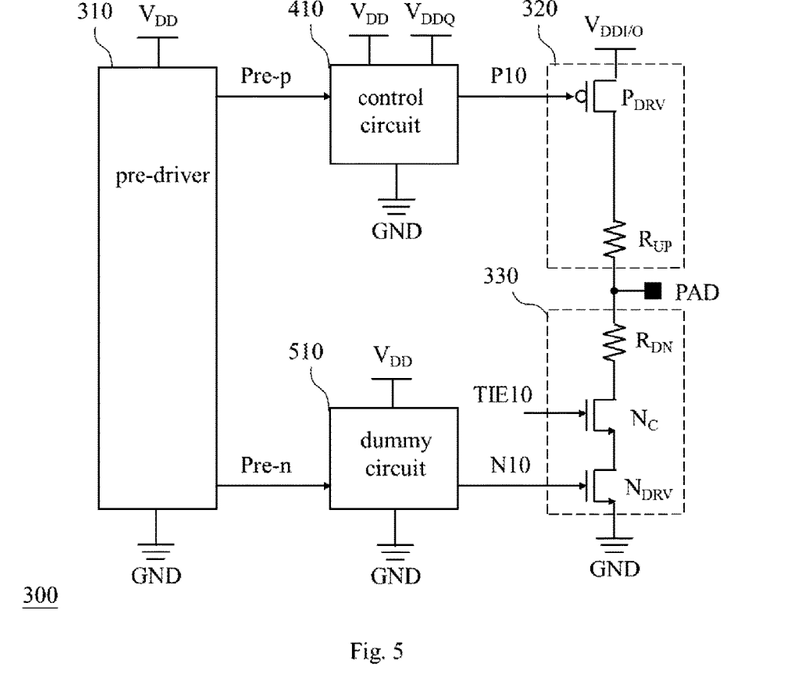
FIG. 5 shows a further embodiment of the DDR4 memory I/O driver of the present invention.

Please refer to FIG. 3. The DDR4 memory I/O driver 300 can not only operate in the transmission mode but also operate in a park mode, in which the definitions of the transmission mode and the park mode are well known in this industrial field. In the park mode, the voltage of the output pad PAD is likely to be higher than the voltage of the second high voltage terminal $V_{DDI/O}$ and this will cause a leakage current. In order to prevent the said leakage current, another embodiment of the DDR4 memory I/O driver of the present invention is disclosed as shown in FIG. 4. In comparison with FIG. 3, the embodiment of FIG. 4 further includes a control circuit 410 electrically connected to the first high voltage terminal $V_{DD}$, a third high voltage terminal $V_{DDQ}$ and the low voltage terminal GND and electrically connected between the pre-driver 310 and the pull-up circuit 320. The control circuit 410 is configured to output a control signal P10 to the driving PMOS transistor $P_{DRV}$ according to the first pre-driving signal Pre-p in the transmission mode and output the voltage of the third high voltage terminal $V_{DDQ}$ to the driving PMOS transistor $P_{DRV}$ in the park mode. Since the voltage of the third high voltage terminal $V_{DDQ}$ is higher than the voltage of the second high voltage terminal $V_{DDI/O}$ and not lower than the voltage of the output pad PAD, in the park mode the driving PMOS transistor $P_{DRV}$ can be fully/effectively turned off to prevent a leakage current from being generated. FIG. 5 shows a further embodiment of the DDR4 memory I/O driver of the present invention. In comparison with FIG. 4, the embodiment of FIG. 5 further includes a dummy circuit 510 electrically connected between the pre-driver 310 and the pull-down circuit 330. The dummy circuit 510 is configured to output a control signal N10 to the driving NMOS transistor $N_{DRV}$ according to the second pre-driving signal Pre-n in the transmission mode and in the park mode. An exemplary implementation of the dummy circuit 510 is a known or self-developed delay circuit, and the signal delay effect caused by the delay circuit is identical or similar to the signal delay effect caused by the control circuit 410; in this case, the control signal N10 is equivalent to the second pre-driving signal Pre-n.

Figure 6:
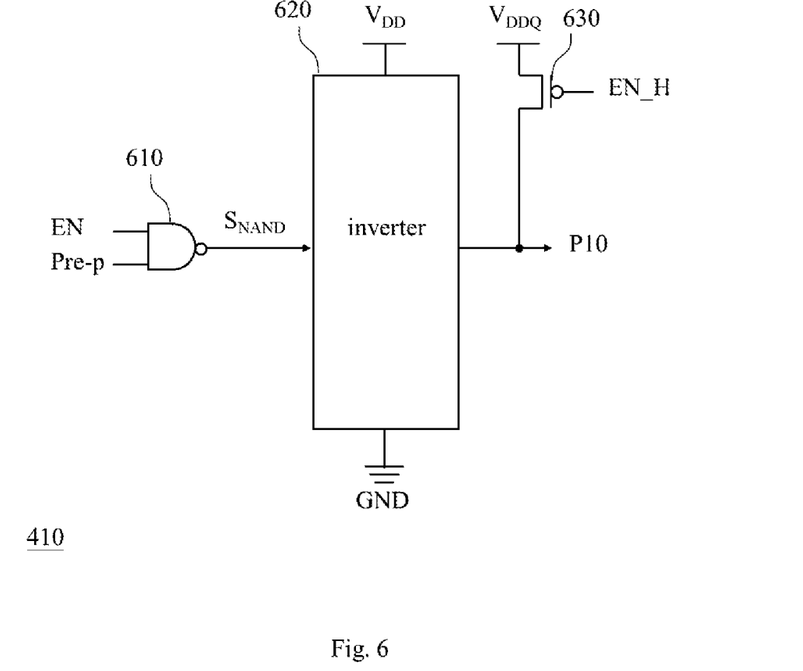
FIG. 6 shows an embodiment of the control circuit of FIGS. 4-5.

FIG. 6 shows an embodiment of the control circuit 410 of FIGS. 4-5. As shown in FIG. 6, the control circuit 410 includes a NAND gate 610, an inverter 620 and a switch 630. The NAND gate 610 is configured to output a NAND gate signal $S_{NAND}$ according to the first pre-driving signal Pre-p and an enablement signal EN. The inverter 620 is configured to output one of the voltage of the first high voltage terminal $V_{DD}$ and the voltage of the low voltage terminal GND as the control signal P10 to the driving PMOS transistor $P_{DRV}$ according to the NAND gate signal $S_{NAND}$ in the transmission mode. The switch 630 is electrically connected between the third high voltage terminal $V_{DDQ}$ and the driving PMOS transistor $P_{DRV}$; the switch 630 is configured to be turned on according to a switch signal EN_H in the park mode so as to output the voltage of the third high voltage terminal $V_{DDQ}$ to the driving PMOS transistor $P_{DRV}$, and the switch 630 is further configured to be turned off according to the switch signal EN_H in the transmission mode.

Figure 7:
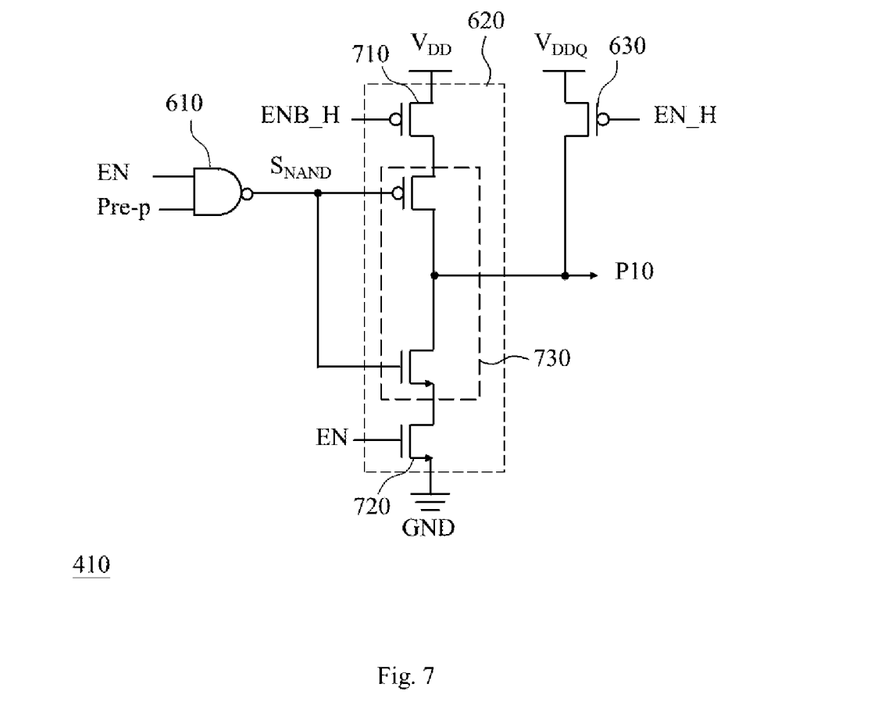
FIG. 7 shows an embodiment of the inverter of FIG. 6.

FIG. 7 shows an embodiment of the inverter 620 of FIG. 6. As shown in FIG. 7, the inverter 620 includes a first switch 710, a second switch 720 and an inversion circuit 730. The first switch 710 is electrically connected between the first high voltage terminal $V_{DD}$ and the inversion circuit 730; the first switch 710 is configured to be turned on according to a switch signal ENB_H (i.e., the inversion signal of the switch signal EN_H) in the transmission mode and configured to be turned off according to the switch signal ENB_H in the park mode. The second switch 720 is electrically connected between the low voltage terminal GND and the inversion circuit 730; the second switch 720 is configured to be turned on according to the enablement signal EN in the transmission mode and configured to be turned off according to the enablement signal EN in the park mode. The inversion circuit 730 is electrically connected between the first switch 710 and the second switch 720 and electrically connected between the NAND gate 610 and the driving PMOS transistor $P_{DRV}$, and the inversion circuit 730 is configured to output one of the voltage of the first high voltage terminal $V_{DD}$ and the voltage of the low voltage terminal GND to the driving PMOS transistor $P_{DRV}$ according to the NAND gate signal $S_{NAND}$ in the transmission mode.

Figure 8:
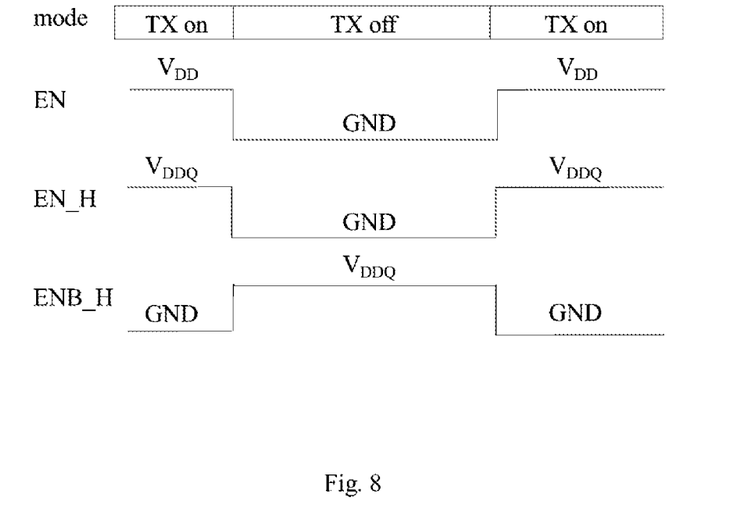
FIG. 8 shows an exemplary implementation of the enablement signal and every switch signal of FIG. 7 in the transmission mode and in the park mode.

FIG. 8 shows an exemplary implementation of the enablement signal EN, the switch signal EN_H and the switch signal ENB_H of FIG. 7 in the transmission mode (indicated by the label "TX on" in FIG. 8) and in the park mode (indicated by the label "TX off" in FIG. 8). As shown in FIG. 8, in the transmission mode the level of the enablement signal EN is equivalent to the voltage of the first high voltage terminal $V_{DD}$, the level of the switch signal EN_H is equivalent to the voltage of the third high voltage terminal $V_{DDQ}$ and the level of the switch signal ENB_H is equivalent to the voltage of the low voltage terminal GND; in the park mode the level of the enablement signal EN is equivalent to the voltage of the low voltage terminal GND, the level of the switch signal EN_H is equivalent to the voltage of the low voltage terminal GND and the level of the switch signal ENB_H is equivalent to the voltage of the third high voltage terminal $V_{DDQ}$.

Figure 9:
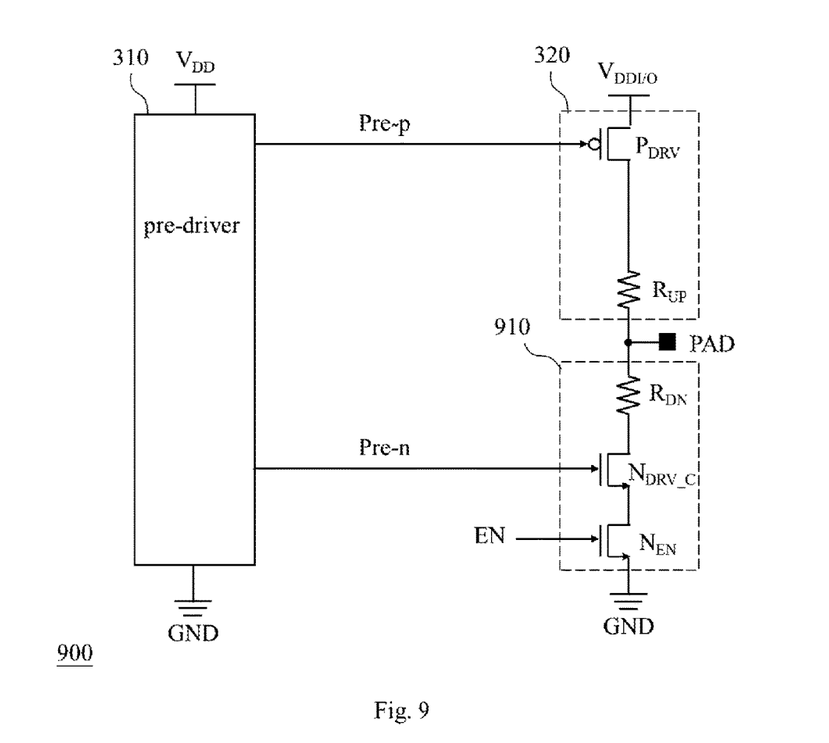
FIG. 9 shows a further embodiment of the DDR4 memory I/O driver of the present invention.

FIG. 9 shows a further embodiment of the DDR4 memory I/O driver of the present invention. In comparison with FIG. 3, in FIG. 9 the second driving signal Pre-n of the DDR4 memory I/O driver 900 is outputted to a cascode NMOS transistor. In detail, the pull-down circuit 910 of FIG. 9 includes an NMOS transistor $N_{EN}$, a driving cascode NMOS transistor $N_{DRV\_C}$, and a pull-down resistor $R_{DN}$. The NMOS transistor $N_{EN}$ is electrically connected between the low voltage terminal GND and the driving cascode NMOS transistor $N_{DRV\_C}$ and configured to operate according to an enablement signal EN. The driving cascode NMOS transistor $N_{DRV\_C}$ is electrically connected between the NMOS transistor $N_{EN}$ and the pull-down resistor $R_{DN}$ and configured to operate according to the second pre-driving signal Pre-n. The pull-down resistor $R_{DN}$ is electrically connected between the driving cascode NMOS transistor $N_{DRV\_C}$ and the output pad PAD. An exemplary implementation of the enablement signal EN of FIG. 9 is the same as the enablement signal EN of FIG. 8.

Figure 10:
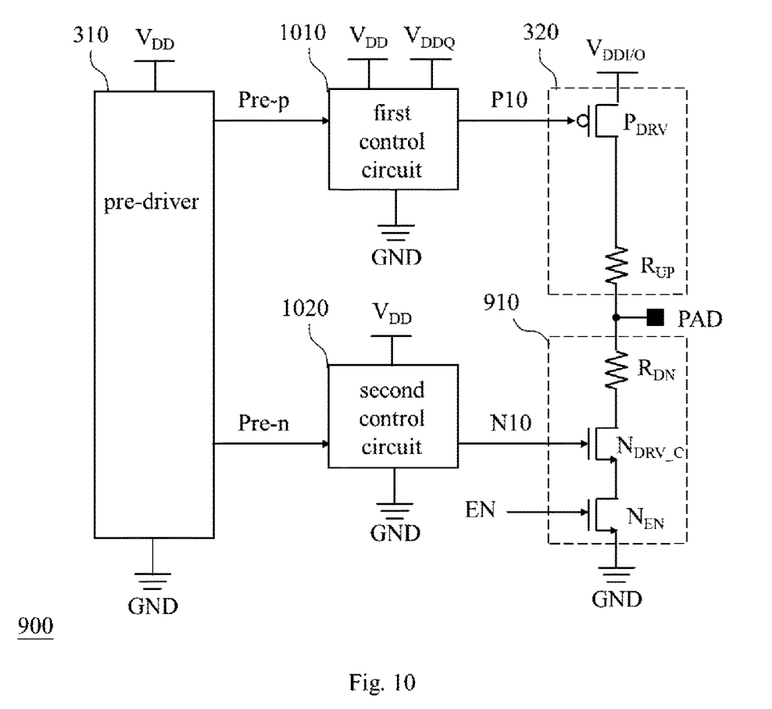
FIG. 10 shows a further embodiment of the DDR4 memory I/O driver of the present invention.

In order to prevent the aforementioned leakage current from being generated, the embodiment of FIG. 9 may further include a first control circuit 1010 as shown in FIG. 10. An exemplary implementation of the first control circuit 1010 is the control circuit 410 of FIG. 4. In addition, in order to prevent the voltage difference between the output pad PAD and the driving cascode NMOS transistor $N_{DRV\_C}$ from exceeding the withstand voltage of the driving cascode NMOS transistor $N_{DRV\_C}$ in the park mode, the embodiment of FIG. 9 may further include a second control circuit 1020 as shown in FIG. 10. In FIG. 10, the second control circuit 1020 is electrically connected to the first high voltage terminal $V_{DD}$ and the low voltage terminal GND and electrically connected between the pre-driver 310 and the pull-down circuit 910; the second control circuit 1020 is configured to output a control signal N10 to the driving cascode NMOS transistor $N_{DRV\_C}$ according to the second pre-driving signal Pre-n in the transmission mode and output the voltage of the first high voltage terminal $V_{DD}$ to the driving cascode NMOS transistor $N_{DRV\_C}$ in the park mode; as a result, in the park mode the voltage difference between the output pad PAD and the driving cascode NMOS transistor $N_{DRV\_C}$ will not exceed the withstand voltage of the driving cascode NMOS transistor $N_{DRV\_C}$.

Figure 11:
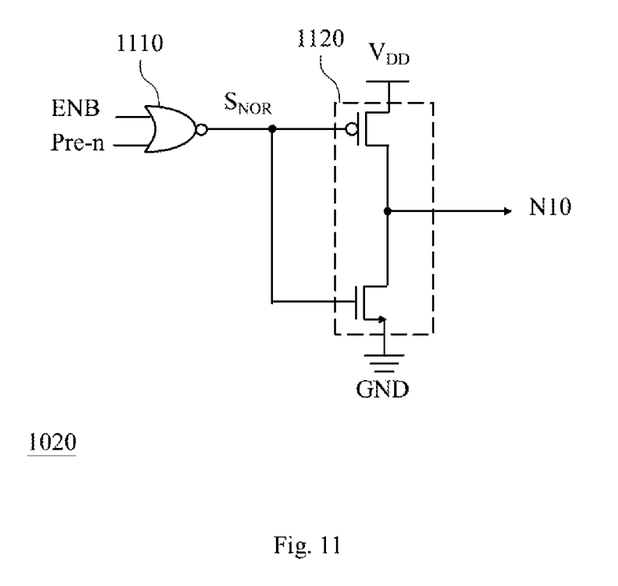
FIG. 11 shows an embodiment of the second control circuit of FIG. 10.

FIG. 11 shows an embodiment of the second control circuit 1020 of FIG. 10. As shown in FIG. 11, the second control circuit 1020 includes a NOR gate 1110 and an inverter 1120. The NOR gate 1110 is configured to output a NOR gate signal $S_{NOR}$ according to the second pre-driving signal Pre-n and the inversion signal ENB of the enablement signal EN. The inverter 1120 is configured to output one of the voltage of the first high voltage terminal $V_{DD}$ and the voltage of the low voltage terminal GND as the control signal N10 to the driving cascode NMOS transistor $N_{DRV\_C}$ according to the NOR gate signal $S_{NOR}$.

Figure 12:
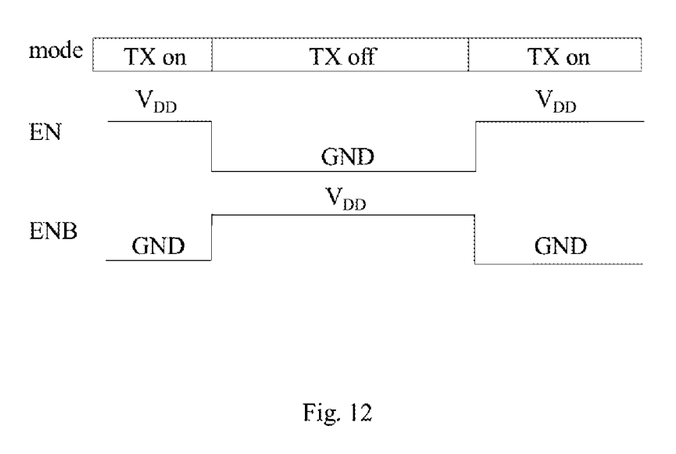
FIG. 12 shows an exemplary implementation of the enablement signal and its inversion signal of FIG. 11 in the transmission mode and in the park mode.

FIG. 12 shows an exemplary implementation of the enablement signal EN and the inversion signal ENB of FIG. 11 in the transmission mode (indicated by the label "TX on" in FIG. 12) and in the park mode (indicated by the label "TX off" in FIG. 12). As shown in FIG. 12, in the transmission mode the level of the enablement signal EN is equivalent to the voltage of the first high voltage terminal $V_{DD}$; in the park mode the level of the enablement signal EN is equivalent to the voltage of the low voltage terminal GND; and the inversion signal ENB is the inversion of the enablement signal EN.

Figure 13:
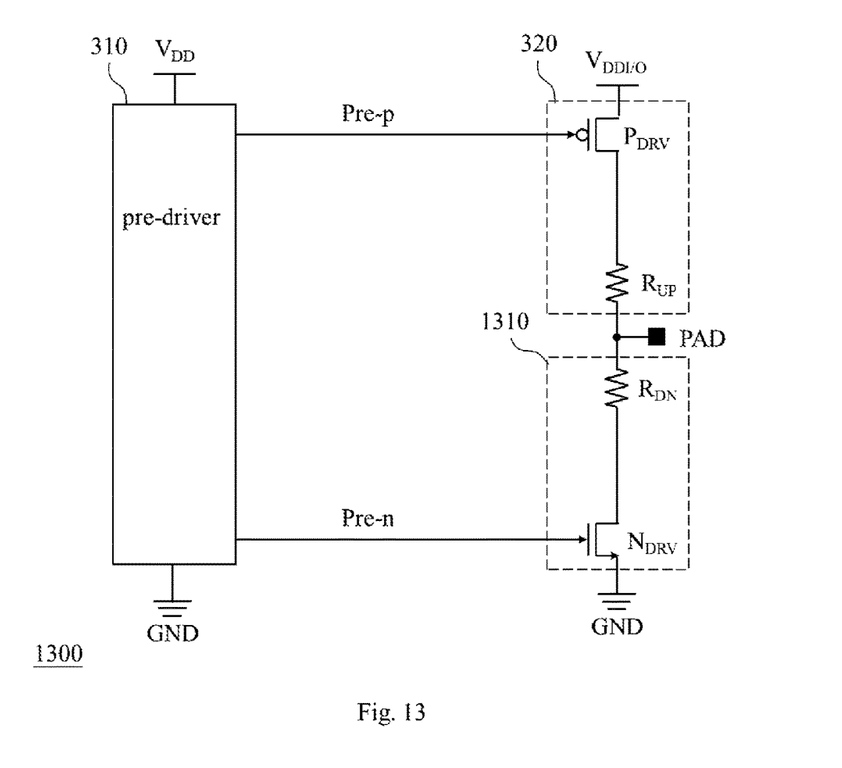
FIG. 13 shows a further embodiment of the DDR4 memory I/O driver of the present invention.

FIG. 13 shows a further embodiment of the DDR4 memory I/O driver of the present invention. In comparison with the embodiment of FIG. 3, in FIG. 13 the pull-down circuit 1310 of the DDR4 memory I/O driver 1300 does not include a cascode NMOS transistor. In detail, the pull-down circuit 1310 includes a driving NMOS transistor $N_{DRV}$ electrically connected between the low voltage terminal GND and a pull-down resistor $R_{DN}$, and the driving NMOS transistor $N_{DRV}$ is configured to operate according to the second pre-driving signal Pre-n. Since the pull-down circuit 1310 does not include a cascode NMOS transistor, the embodiment of FIG. 13 is suitable for a low power DDR4 memory device.

Since those of ordinary skill in the art can appreciate the detail and the modification of one embodiment by referring to the other embodiments of the present specification, repeated and redundant description is omitted here provided the written description and enablement requirement is still fulfilled.

To sum up, the DDR4 memory I/O driver of the present invention can operate in a single power domain in the transmission mode, consume a smaller circuit area due to the omission of an LDO, and provide a wider bandwidth due to the omission of a cascode PMOS circuit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A Double Data Rate Fourth Generation (DDR4) memory I/O driver comprising:
    a pre-driver electrically connected between a first high voltage terminal and a low voltage terminal to provide a first pre-driving signal and a second pre-driving signal;
    a pull-up circuit including:
        a driving PMOS transistor electrically connected between a second high voltage terminal and a pull-up resistor to operate according to the first pre-driving signal in a transmission mode, in which a voltage of the second high voltage terminal is not higher than a voltage of the first high voltage terminal; and
        the pull-up resistor electrically connected between the driving PMOS transistor and an output pad; and
    a pull-down circuit includes:
        a driving NMOS transistor electrically connected between the low voltage terminal and a cascode NMOS transistor to operate according to the second pre-driving signal;
        the cascode NMOS transistor electrically connected between the driving NMOS transistor and a pull-down resistor to operate according to a bias, in which the bias is not higher than the voltage of the second high voltage terminal; and
        the pull-down resistor electrically connected between the cascode NMOS transistor and the output pad.

2. The DDR4 memory I/O driver of claim 1, wherein the voltage of the second high voltage terminal is equal to the voltage of the first high voltage terminal.

3. The DDR4 memory I/O driver of claim 2, wherein the bias is equal to the voltage of the second high voltage terminal.

4. The DDR4 memory I/O driver of claim 1, further comprising:
    a control circuit electrically connected to the first high voltage terminal, a third high voltage terminal and the low voltage terminal and electrically connected between the pre-driver and the pull-up circuit, and the control circuit configured to output a control signal to the driving PMOS transistor according to the first pre-driving signal in the transmission mode and output a voltage of the third high voltage terminal to the driving PMOS transistor in a park mode,
    wherein the voltage of the third high voltage terminal is higher than the voltage of the second high voltage terminal.

5. The DDR4 memory I/O driver of claim 4, wherein in the park mode a voltage of the output pad is higher than the voltage of the second high voltage terminal and the voltage of the third high voltage terminal is not lower than the voltage of the output pad.

6. The DDR4 memory I/O driver of claim 4, wherein the control circuit includes:
    a NAND gate configured to output a NAND gate signal according to the first pre-driving signal and an enablement signal;
    an inverter configured to output one of the voltage of the first high voltage terminal and a voltage of the low voltage terminal to the driving PMOS transistor according to the NAND gate signal in the transmission mode; and
    a switch electrically connected between the third high voltage terminal and the driving PMOS transistor, and the switch configured to be turned on in the park mode so as to output the voltage of the third high voltage terminal to the driving PMOS transistor.

7. The DDR4 memory I/O driver of claim 6, wherein the inverter includes:
    a first switch electrically connected between the first high voltage terminal and an inversion circuit, and the first switch configured to be turned on in the transmission mode and turned off in the park mode;
    a second switch electrically connected between the low voltage terminal and the inversion circuit, and the second switch configured to be turned on in the transmission mode and turned off in the park mode; and
    the inversion circuit electrically connected between the first switch and the second switch and electrically connected between the NAND gate and the driving PMOS transistor, and the inversion circuit configured to output one of the voltage of the first high voltage terminal and the voltage of the low voltage terminal to the driving PMOS transistor according to the NAND gate signal in the transmission mode.

8. The DDR4 memory I/O driver of claim 4, further comprising a dummy circuit electrically connected between the pre-driver and the pull-down circuit, wherein the dummy circuit is configured to output another control signal to the driving NMOS transistor according to the second pre-driving signal in the transmission mode and in the park mode.

9. The DDR4 memory I/O driver of claim 8, wherein the dummy circuit is a delay circuit and the another control signal is a delayed signal of the second pre-driving signal.

10. A Double Data Rate Fourth Generation (DDR4) memory I/O driver comprising:
    a pre-driver electrically connected between a first high voltage terminal and a low voltage terminal to provide a first pre-driving signal and a second pre-driving signal;
    a pull-up circuit including:
        a driving PMOS transistor electrically connected between a second high voltage terminal and a pull-up resistor to operate according to the first pre-driving signal in a transmission mode, in which a voltage of the second high voltage terminal is not higher than a voltage of the first high voltage terminal; and
        the pull-up resistor electrically connected between the driving PMOS transistor and an output pad; and
    a pull-down circuit includes:
        an NMOS transistor electrically connected between the low voltage terminal and a driving cascode NMOS transistor to operate according to an enablement signal;

the driving cascode NMOS transistor electrically connected between the NMOS transistor and a pull-down resistor to operate according to the second pre-driving signal; and the pull-down resistor electrically connected between the driving cascode NMOS transistor and the output pad.

11. The DDR4 memory I/O driver of claim 10, wherein the enablement signal is equivalent to a voltage of the low voltage terminal in the transmission mode and the enablement signal is equivalent to the voltage of the first high voltage terminal in a park mode.

12. The DDR4 memory I/O driver of claim 10, wherein the voltage of the second high voltage terminal is equal to the voltage of the first high voltage terminal.

13. The DDR4 memory I/O driver of claim 10, further comprising:

a first control circuit electrically connected to the first high voltage terminal, a third high voltage terminal and the low voltage terminal and electrically connected between the pre-driver and the pull-up circuit, and the first control circuit configured to output a first control signal to the driving PMOS transistor according to the first pre-driving signal in the transmission mode and output a voltage of the third high voltage terminal to the driving PMOS transistor in a park mode; and a second control circuit electrically connected to the first high voltage terminal and the low voltage terminal and electrically connected between the pre-driver and the pull-down circuit, and the second control circuit configured to output a second control signal to the driving cascode NMOS transistor according to the second pre-driving signal in the transmission mode and output the voltage of the first high voltage terminal to the driving cascode NMOS transistor in the park mode, wherein the voltage of the third high voltage terminal is higher than the voltage of the second high voltage terminal.

14. The DDR4 memory I/O driver of claim 13, wherein in the park mode a voltage of the output pad is higher than the voltage of the second high voltage terminal and the voltage of the third high voltage terminal is not lower than the voltage of the output pad.

15. The DDR4 memory I/O driver of claim 13, wherein the first control circuit includes:

a NAND gate configured to output a NAND gate signal according to the first pre-driving signal and the enablement signal;

an inverter configured to output one of the voltage of the first high voltage terminal and a voltage of the low voltage terminal to the driving PMOS transistor according to the NAND gate signal in the transmission mode; and a switch electrically connected between the third high voltage terminal and the driving PMOS transistor, and the switch configured to be turned on in the park mode so as to output the voltage of the third high voltage terminal to the driving PMOS transistor.

16. The DDR4 memory I/O driver of claim 15, wherein the inverter includes:

a first switch electrically connected between the first high voltage terminal and an inversion circuit, and the first switch configured to be turned on in the transmission mode and turned off in the park mode;

a second switch electrically connected between the low voltage terminal and the inversion circuit, and the second switch configured to be turned on in the transmission mode and turned off in the park mode; and the inversion circuit electrically connected between the first switch and the second switch and electrically connected between the NAND gate and the driving PMOS transistor, and the inversion circuit configured to output one of the voltage of the first high voltage terminal and the voltage of the low voltage terminal to the driving PMOS transistor according to the NAND gate signal in the transmission mode.

17. The DDR4 memory I/O driver of claim 13, wherein the second control circuit includes:

a NOR gate configured to output a NOR gate signal according to the second pre-driving signal and an inversion signal of the enablement signal; and an inverter configured to output one of the voltage of the first high voltage terminal and a voltage of the low voltage terminal to the driving cascode NMOS transistor according to the NOR gate signal in the transmission mode.

18. A Double Data Rate Fourth Generation (DDR4) memory I/O driver comprising:

a pre-driver electrically connected between a first high voltage terminal and a low voltage terminal to provide a first pre-driving signal and a second pre-driving signal;

a pull-up circuit including:

a driving PMOS transistor electrically connected between a second high voltage terminal and a pull-up resistor to operate according to the first pre-driving signal in a transmission mode, in which a voltage of the second high voltage terminal is not higher than a voltage of the first high voltage terminal; and the pull-up resistor electrically connected between the driving PMOS transistor and an output pad; and a pull-down circuit includes:

a driving NMOS transistor electrically connected between the low voltage terminal and a pull-down resistor to operate according to the second pre-driving signal; and the pull-down resistor electrically connected between the driving NMOS transistor and the output pad.

* * * * *